(12) United States Patent
Hur (10) Patent No.: US 8,319,544 B2
(45) Date of Patent: Nov. 27, 2012

(54) DETERMINING AND USING DYNAMIC VOLTAGE SCALING MODE

(75) Inventor: Young Do Hur, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 77 days.

(21) Appl. No.: 12/947,081

(22) Filed: Nov. 16, 2010

(65) Prior Publication Data

US 2012/0007661 A1 Jan. 12, 2012

(30) Foreign Application Priority Data

Jul. 6, 2010 (KR) .................. 10-2010-0064640

(51) Int. Cl.
*G05F 1/46* (2006.01)
*G06F 1/32* (2006.01)

(52) U.S. Cl. .......................... 327/535; 363/59
(58) Field of Classification Search ................ None
See application file for complete search history.

(56) References Cited

U.S. PATENT DOCUMENTS

| 7,583,555 B2 * | 9/2009 | Kang et al. ............. 365/226 |
| 7,782,125 B2 * | 8/2010 | Shimura ................. 327/544 |
| 2005/0188233 A1 | 8/2005 | Park |
| 2009/0213673 A1 * | 8/2009 | Flautner et al. ........... 365/203 |
| 2010/0138684 A1 | 6/2010 | Kim et al. |

FOREIGN PATENT DOCUMENTS

| JP | 2005-235223 | 9/2005 |
| KR | 100911202 B1 | 7/2009 |
| KR | 1020100047216 A | 5/2010 |

* cited by examiner

*Primary Examiner* — Lincoln Donovan
*Assistant Examiner* — Terry L Englund
(74) *Attorney, Agent, or Firm* — William Park & Associates Ltd.

(57) ABSTRACT

A mode determination apparatus in a semiconductor apparatus includes a first condition detection block configured to generate a first condition signal in response to a clock enable signal activated when the semiconductor apparatus enters a dynamic voltage scaling mode, a second condition detection block configured to generate a second condition signal in response to an external high voltage in the dynamic voltage scaling mode, the external high voltage having a voltage level in the dynamic voltage scaling mode different from a voltage level in a normal mode, and a signal processing block configured to generate a dynamic voltage scaling mode signal in response to the first condition signal and the second condition signal.

23 Claims, 5 Drawing Sheets

DETERMINING AND USING DYNAMIC VOLTAGE SCALING MODE

CROSS-REFERENCES TO RELATED APPLICATION

The present application claims priority under 35 U.S.C. §119(a) to Korean Application No. 10-2010-0064640, filed on Jul. 6, 2010, in the Korean Intellectual Property Office, which is incorporated herein by reference in its entirety as if set forth in full.

BACKGROUND

1. Technical Field

The present invention relates to a semiconductor apparatus, and more particularly, to a semiconductor apparatus that is capable of operating in a dynamic voltage scaling mode.

2. Related Art

Various semiconductor apparatuses receive external voltages VDD from outside and generate internal voltages with different levels from that of the external voltage VDD. Some of the internal voltages (hereinafter, referred to as internal high voltages) may be higher than the external voltages VDD supplied from outside of the semiconductor apparatuses. A semiconductor memory apparatus such as a DRAM generates an internal high voltage, particularly, a pumping voltage VPP (hereinafter, the internal high voltage will be exemplified as the pumping voltage VPP), as a voltage for driving word lines.

The internal high voltage VPP is generated by repeating the steps of feeding back the current level of an internal high voltage VPP, comparing the current level of the internal high voltage VPP with the level of a target voltage, and increasing the level of the internal high voltage VPP according to the comparison result. In order to perform the operation of feeding back the current level of the internal high voltage VPP and comparing the current level of the internal high voltage VPP with the level of the target voltage, a pumping voltage detection apparatus is used.

The pumping voltage detection apparatus detects the level of the internal high voltage VPP, determines whether the internal high voltage VPP has reached the target voltage, and generates a pumping enable signal. When the level of the internal high voltage VPP is higher than the level of the target voltage, the pumping voltage detection apparatus typically deactivates the pumping enable signal. However, when the level of the internal high voltage VPP is lower than the level of the target voltage, the pumping voltage detection apparatus activates and outputs the pumping enable signal. The pumping enable signal generated as described above is inputted to a pumping circuit of a semiconductor apparatus and is used to control a pumping operation of the internal high voltage VPP.

Some of the recently developed semiconductor apparatuses, DRAMs in particular, employ a dynamic voltage scaling mode to reduce power consumption. Since a low external voltage VDD is supplied in the dynamic voltage scaling mode as opposed to a normal mode, power consumption of the semiconductor apparatus may be reduced.

With the recent development of semiconductor apparatuses after a DDR3 technology, DRAMs in particular, for example, there has been proposed a method of additionally receiving an external high voltage VPPEXT as another supply voltage supplied from outside of the semiconductor apparatus as well as the external voltage VDD. The external high voltage VPPEXT has a level higher than that of the external voltage VDD, and is used for internal circuits of the semiconductor apparatus which require a higher voltage than the external voltage VDD. The semiconductor apparatus additionally generates the internal high voltage VPP, separately from the external high voltage VPPEXT.

In the dynamic voltage scaling mode, the supply voltages such as the external voltage VDD and the external high voltage VPPEXT supplied from outside of the semiconductor apparatus are lower than those in the normal mode. The semiconductor apparatus operates using the lower external voltage VDD and the lower external high voltage VPPEXT as compared with the normal mode, resulting in the reduction in power consumption. When a lower internal high voltage VPP is generated in the dynamic voltage scaling mode as compared with the normal mode, the above-mentioned power consumption reduction effect may be further increased. However, since the internal high voltage VPP with the same level is generated in the dynamic voltage scaling mode and the normal mode in the conventional art without detecting the external high voltage VPPEXT, power may be unnecessarily consumed.

SUMMARY

In one embodiment of the present invention, a mode determination apparatus in a semiconductor apparatus includes: a first condition detection block configured to generate a first condition signal in response to a clock enable signal, the clock enable signal being activated when the semiconductor apparatus enters a dynamic voltage scaling mode; a second condition detection block configured to generate a second condition signal in response to an external high voltage in the dynamic voltage scaling mode, the external high voltage having a voltage level in the dynamic voltage scaling mode different from a voltage level in a normal mode; and a signal processing block configured to generate a dynamic voltage scaling mode signal in response to the first condition signal and the second condition signal.

In another embodiment of the present invention, a method for determining a dynamic voltage scaling mode includes the steps of activating a first condition signal by detecting whether a clock enable signal is activated; activating a second condition signal by detecting that an external high voltage is lowered to a predetermined level or less; and activating a dynamic voltage scaling mode signal in response to the first condition signal and the second condition signal.

In still another embodiment of the present invention, an apparatus for detecting a pumping voltage in a semiconductor apparatus includes: a dynamic voltage scaling mode determination unit configured to generate a dynamic voltage scaling mode signal that activated when the semiconductor apparatus enters a dynamic voltage scaling mode; and a pumping signal generation unit configured to generate a pumping enable signal by comparing an internal high voltage with a different comparative high voltage according to the dynamic voltage scaling mode signal.

In still another embodiment of the present invention, a method for detecting a pumping voltage includes the steps of: activating a first condition signal by detecting whether a clock enable signal is activated; activating a second condition signal by detecting that an external high voltage is lowered to a predetermined level or less; activating a dynamic voltage scaling mode signal in response to the first condition signal and the second condition signal; dividing an internal high voltage in response to the dynamic voltage scaling mode signal to generate a comparative high voltage; and comparing the comparative high voltage with a reference voltage to generate a pumping enable signal.

BRIEF DESCRIPTION OF THE DRAWINGS

Features, aspects, and embodiments are described in conjunction with the attached drawings, in which.

DETAILED DESCRIPTION

The present invention proposes a mode determination apparatus, which can determine whether a semiconductor apparatus operates in a dynamic voltage scaling mode or a normal mode. Furthermore, the present invention proposes an apparatus for detecting a pumping voltage, which compares an internal high voltage with a different comparison voltage according to a dynamic voltage scaling mode signal generated by the apparatus for determining the dynamic voltage scaling mode, and generates a pumping enable signal.

Figure 1:
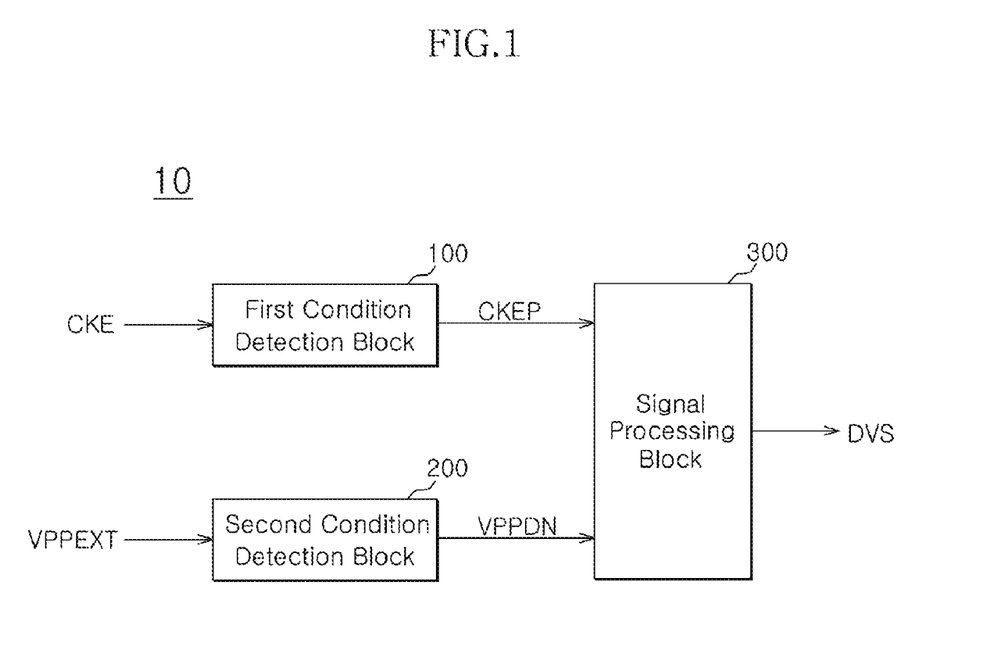
FIG. 1 is a block diagram of a mode determination apparatus according to one embodiment.

FIG. 1 is a block diagram of the mode determination apparatus according to one embodiment of the present invention.

When a semiconductor apparatus (particularly, a DRAM) capable of operating in the dynamic voltage scaling mode enters the dynamic voltage scaling mode, a clock enable signal CKE is activated. The clock enable signal CKE is used to control the self-refresh operation of the DRAM.

As described above, in the dynamic voltage scaling mode, a lower external high voltage VPPEXT is inputted from outside of the semiconductor apparatus as compared with the normal mode.

The mode determination apparatus shown in FIG. 1 according to one embodiment of the invention is configured to detect the clock enable signal CKE and the external high voltage VPPEXT, determine whether the semiconductor apparatus operates in the dynamic voltage scaling mode, and output the determination result as a dynamic voltage scaling mode signal DVS.

The mode determination apparatus includes a first condition detection block 100, a second condition detection block 200, and a signal processing block 300.

The first condition detection block 100 is configured to detect the clock enable signal CKE which is activated when the semiconductor apparatus enters the dynamic voltage scaling mode, and generate a first condition signal CKEP based on the detection result.

The second condition detection block 200 is configured to detect the external high voltage VPPEXT in the dynamic voltage scaling mode, which has a level different from that in the normal mode, and generate a second condition signal VPPDN based on the detection result.

The signal processing block 300 is configured to generate the dynamic voltage scaling mode signal DVS in response to the first condition signal CKEP and the second condition signal VPPDN.

The clock enable signal CKE is a low-active signal and is used to control the self-refresh operation of the DRAM as described above. Thus, when the clock enable signal CKE is activated, the first condition detection block 100 allows the first condition signal CKEP to be activated. The first condition detection block 100 may generate the first condition signal CKEP by adjusting an activation timing, a pulse width and a level of the clock enable signal CKE according to the operation scheme in which the signal processing block 300 uses the first condition signal CKEP.

The second condition detection block 200 may be configured to compare the level of the external high voltage VPPEXT with a predetermined level, and output the comparison result as the second condition signal VPPDN.

The signal processing block 300 may be configured to check the first condition signal CKEP having activation information of the clock enable signal CKE and the second condition signal VPPDN having level information of the external high voltage VPPEXT, and generate the dynamic voltage scaling mode signal DVS. In the dynamic voltage scaling mode, the external high voltage VPPEXT is lower as compared with the normal mode. The clock enable signal CKE is activated when the semiconductor apparatus enters the dynamic voltage scaling mode. Thus, when both the first condition signal CKEP and the second condition signal VPPDN are activated, the signal processing block 300 may activate the dynamic voltage scaling mode signal DVS. When the dynamic voltage scaling mode is ended and the semiconductor apparatus enters the normal mode, the external high voltage VPPEXT is increased to a higher level in the normal mode and the clock enable signal CKE is activated. Thus, when the first condition signal CKEP is activated and the second condition signal VPPDN is deactivated, the signal processing block 300 may deactivate the dynamic voltage scaling mode signal DVS. In the dynamic voltage scaling mode, the external high voltage VPPEXT is lower as compared with the normal mode, but the clock enable signal CKE is repeatedly activated and deactivated depending on the refresh operation. In this regard, the signal processing block 300 may be configured to check the second condition signal VPPDN having the information of the external high voltage VPPEXT and the first condition signal CKEP having the information of the clock enable signal CKE, and generate the dynamic voltage scaling mode signal DVS.

Figure 2:
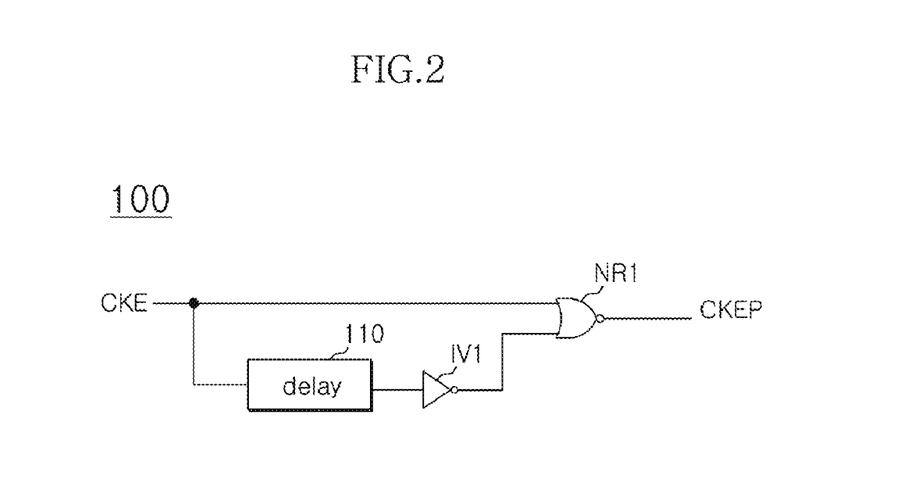
FIG. 2 is a circuit diagram of a first condition detection block 100 shown in FIG. 1 according to one embodiment.

FIG. 2 is a circuit diagram of the first condition detection block 100 shown in FIG. 1 according to one embodiment.

The first condition detection block 100 may include a first NOR gate NR1, a first inverter IV1, and a delay unit 110. The delay unit 110 is configured to delay the clock enable signal CKE and output a delayed signal. The first inverter IV1 is configured to invert the signal outputted from the delay unit 110 and output an inverted signal. The first NOR gate NR1 is configured to output the first condition signal CKEP by performing a NOR operation on the signal outputted from the first inverter IV1 and the clock enable signal CKE. The first condition signal CKEP generated according to the operation of the first condition detection block 100 is activated upon the activation of the clock enable signal CKE and is substantially maintained the activated state during the delay time of the delay unit 110. The first condition detection block 100 shown in FIG. 2 is designed to include the first NOR gate NR1 considering the fact that the clock enable signal CKE is a low-active signal. However, the first condition detection block 100 may alternatively include a different type of logic gates (for example, a NAND gate) according to the activation level of the clock enable signal CKE inputted to the first condition detection block 100, instead of the first NOR gate NR1.

Figure 3:
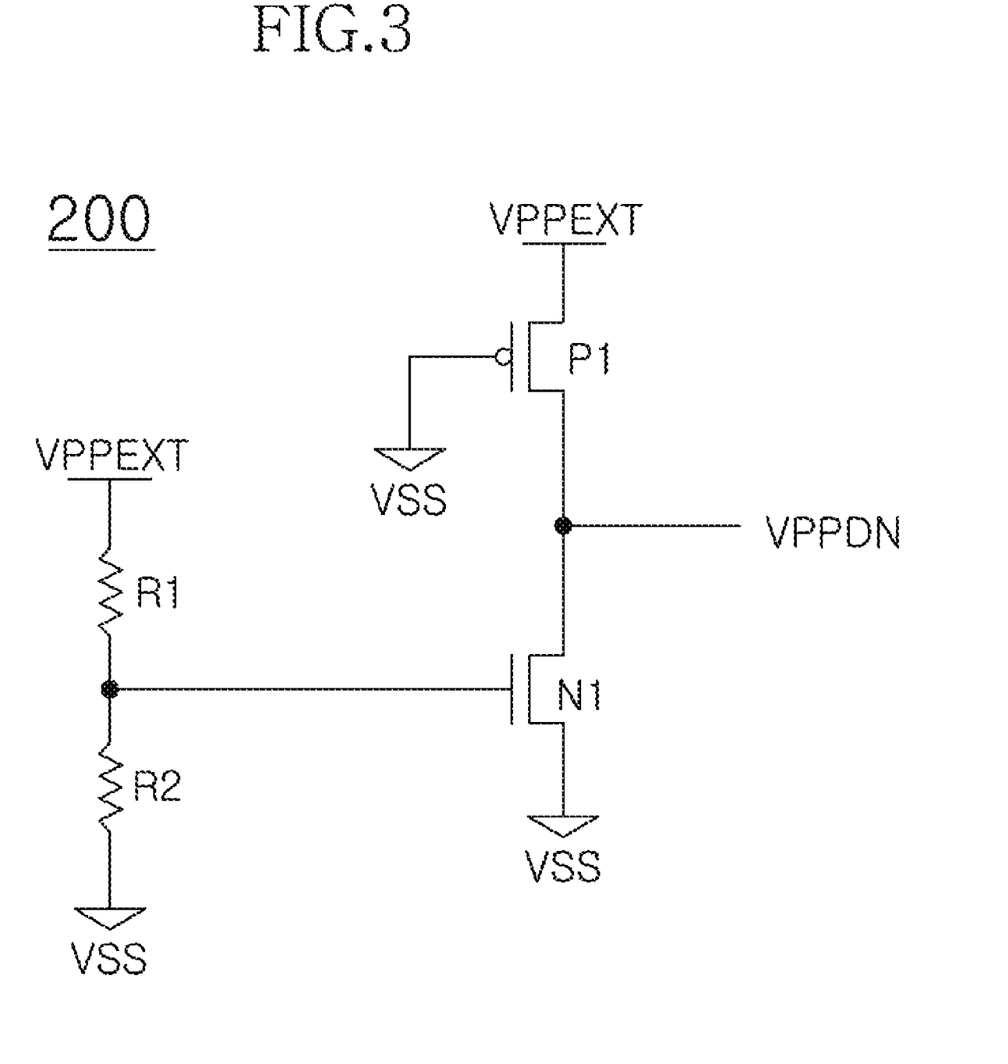
FIG. 3 is a circuit diagram of a second condition detection block 200 shown in FIG. 1 according to one embodiment.

FIG. 3 is a circuit diagram of the second condition detection block 200 shown in FIG. 1 according to one embodiment.

The second condition detection block 200 may include a first resistor R1, a second resistor R2, a first PMOS transistor P1, and a first NMOS transistor N1. The first resistor R1 and the second resistor R2 are connected in series between a terminal for the external high voltage VPPEXT and a terminal for a ground voltage VSS. The first PMOS transistor P1 is connected between the terminal for the external high voltage VPPEXT and a drain terminal of the first NMOS transistor N1. A gate of the first PMOS transistor P1 receives the ground voltage VSS. The first NMOS transistor N1 is connected between a drain terminal of the first PMOS transistor P1 and the terminal for the ground voltage VSS. A gate of the first NMOS transistor N1 receives a voltage of a common node of the first resistor R1 and the second resistor R2. A voltage of a common drain terminal of the first PMOS transistor P1 and the first NMOS transistor N1 is outputted as the second condition signal VPPDN. The second condition detection block 200 shown in FIG. 3 operates as follows. In the normal mode in which the external high voltage VPPEXT is high as compared with the dynamic voltage scaling mode and the second condition signal VPPDN is in a deactivated state, as the external high voltage VPPEXT is gradually lowered, the voltage level of the common node of the first resistor R1 and the second resistor R2 is also gradually lowered. Thus, the voltage difference between the gate and a source of the first NMOS transistor N1 is gradually lowered, so that a current for discharging the common drain terminal of the first NMOS transistor N1 and the first PMOS transistor P1 is lowered. When the external high voltage VPPEXT is lowered to a predetermined level or less and a current for discharging the common drain terminal through the first NMOS transistor N1 is smaller than a current for discharging the common drain terminal through the first PMOS transistor P1, the second condition signal VPPDN is at a high level. If the external high voltage VPPEXT is gradually increased, the voltage level of the common node of the first resistor R1 and the second resistor R2 is also gradually increased. Thus, the voltage difference between a gate and a source of the first NMOS transistor N1 is gradually increased, so that the current for discharging the common drain terminal of the first NMOS transistor N1 and the first PMOS transistor P1 is increased. When the external high voltage VPPEXT is increased to the predetermined level or more and the current for discharging the common drain terminal through the first NMOS transistor N1 is larger than the current for discharging the common drain terminal through the first PMOS transistor P1, the second condition signal VPPDN is at a low level. Since the resistance values of the first resistor R1 and the second resistor R2 and the sizes of the first NMOS transistor N1 and the first PMOS transistor P1 serve as factors for determining whether the value of the second condition signal VPPDN may be changed when the external high voltage VPPEXT has reached a certain voltage, that is, the predetermined level, the second condition detection block 200 may be designed considering the level of the external high voltage VPPEXT in the dynamic voltage scaling mode and the level of the external high voltage VPPEXT in the normal mode.

Figure 4A:
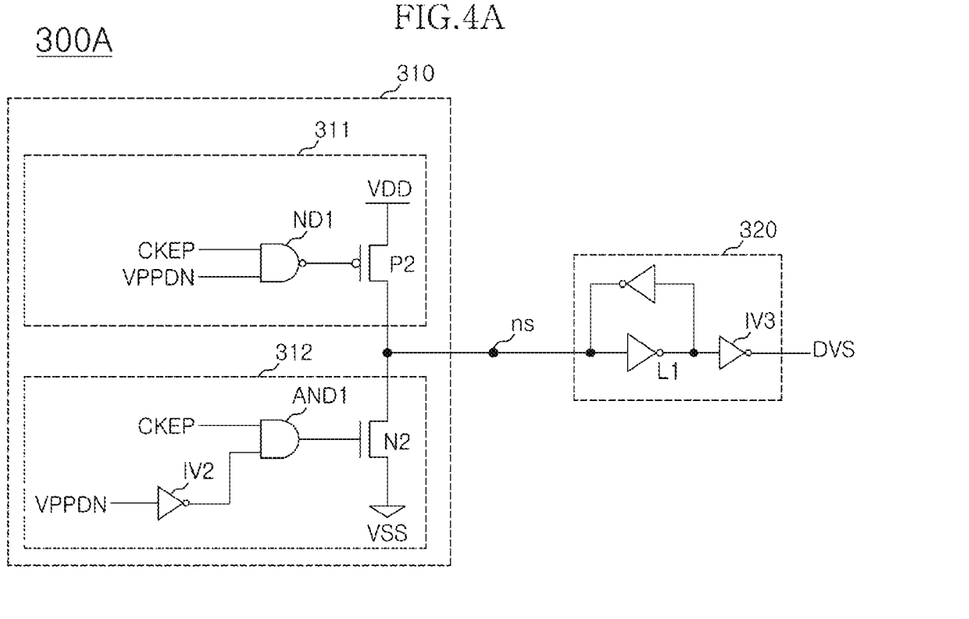
FIG. 4A is a circuit diagram of a signal processing block 300 shown in FIG. 1 according to one embodiment.

FIG. 4A is a circuit diagram of the signal processing block 300 shown in FIG. 1 according to one embodiment.

The signal processing block 300A shown in FIG. 4A may include a signal change unit 310 and a signal maintaining unit 320.

The signal change unit 310 is configured to drive a state node 'ns' in response to the first condition signal CKEP and the second condition signal VPPDN.

The signal maintaining unit 320 is configured to output the voltage of the state node 'ns' as the dynamic voltage scaling mode signal DVS and latch the state node 'ns'.

The signal change unit 310 may include a signal activation section 311 and a signal deactivation section 312.

The signal activation section 311 is configured to charge the state node 'ns' in response to the first condition signal CKEP and the second condition signal VPPDN. Since the voltage of the state node 'ns' is outputted as the dynamic voltage scaling mode signal DVS by the signal maintaining unit 320, the signal activation section 311 may charge the state node 'ns' when both the first condition signal CKEP and the second condition signal VPPDN are activated. The signal activation section 311 may include a first NAND gate ND1 and a second PMOS transistor P2. The first NAND gate ND1 is configured to perform a NAND operation on the first condition signal CKEP and the second condition signal VPPDN. The second PMOS transistor P2 is connected between a terminal for an external voltage VDD and the state node 'ns' to receive a voltage outputted from the first NAND gate ND1. When both the first condition signal CKEP and the second condition signal VPPDN are activated, the first NAND gate ND1 outputs a low level through the NAND operation, so that the second PMOS transistor P2 is turned on and the state node 'ns' is charged.

The signal deactivation section 312 is configured to discharge the state node 'ns' in response to the first condition signal CKEP and the second condition signal VPPDN. Since the voltage of the state node 'ns' is outputted as the dynamic voltage scaling mode signal DVS by the signal maintaining unit 320 as described above, the signal deactivation section 312 may discharge the state node 'ns' when the first condition signal CKEP is activated and the second condition signal VPPDN is deactivated. The signal deactivation section 312 may include a second inverter IV2, a first AND gate AND1, and a second NMOS transistor N2. The second inverter IV2 is configured to invert the second condition signal VPPDN and output an inverted second condition signal VPPDN. The first AND gate AND1 performs an AND operation on the inverted second condition signal VPPDN outputted from the second inverter IV2 and the first condition signal CKEP. The second NMOS transistor N2 is connected between the state node 'ns' and the terminal for the ground voltage VSS to receive a voltage outputted from the first AND gate AND1. When the first condition signal CKEP is activated and the second condition signal VPPDN is deactivated, the first AND gate AND1 outputs a high level through the AND operation, so that the second NMOS transistor N2 is turned on and the state node 'ns' is discharged.

The signal maintaining unit 320 may include a first latch L1 and a third inverter IV3. The first latch L1 is connected to the state node 'ns' to perform a latch operation. The third inverter IV3 is configured to output the dynamic voltage scaling mode signal DVS by inverting the output of the first latch L1.

Figure 4B:
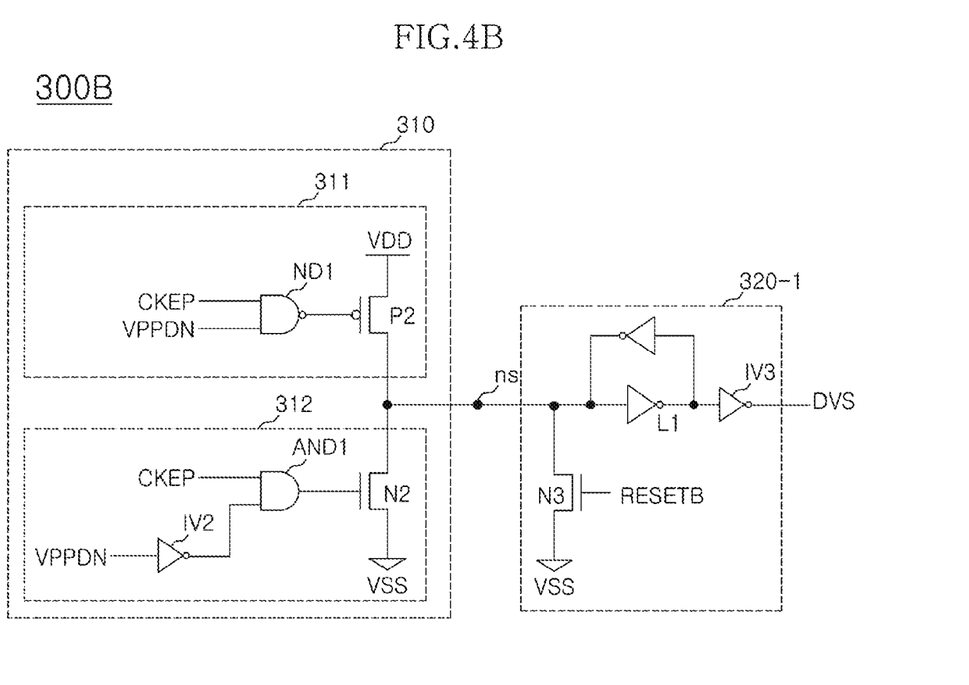
FIG. 4B is a circuit diagram of a signal processing block 300 shown in FIG. 1 according to another embodiment.

FIG. 4B is a circuit diagram of the signal processing block 300 shown in FIG. 1 according to another embodiment.

The signal processing block 300B shown in FIG. 4B has a configuration similar to that of the signal processing block 300A shown in FIG. 4A, and may include the signal change unit 310 and a signal maintaining unit 320-1 as shown in FIG. 4A. Since the signal change unit 310 shown in FIG. 4B has a same configuration as that of the signal change unit 310 shown in FIG. 4A, a detailed description will be omitted. The signal maintaining unit 320-1 further includes a third NMOS transistor N3, which initializes the dynamic voltage scaling mode signal DVS in response to a reset signal RESETB, in addition to the signal maintaining unit 320 shown in FIG. 4A. The signal maintaining unit 320-1 may further perform an operation of initializing the dynamic voltage scaling mode signal DVS in response to the reset signal RESETB. When the signal maintaining unit 320 is configured as shown in FIG. 4A, if the first condition signal CKEP and the second condition signal VPPDN have unreliable information, it may not be possible to predict the value of the dynamic voltage scaling mode signal DVS. However, when the signal maintaining unit 320-1 is configured as shown in FIG. 4B, if the first condition signal CKEP and the second condition signal VPPDN have unreliable information, the reset signal RESETB is activated to initialize the dynamic voltage scaling mode signal DVS, so that it may be possible to provide the predictable dynamic voltage scaling mode signal DVS for the operation of the semiconductor apparatus including the apparatus for determining the dynamic voltage scaling mode. The reset signal RESETB is used to control the initialization operation of the DRAM. The operation of the semiconductor apparatus including the signal processing block 300B provided in FIG. 4B will be described later.

Figure 5:
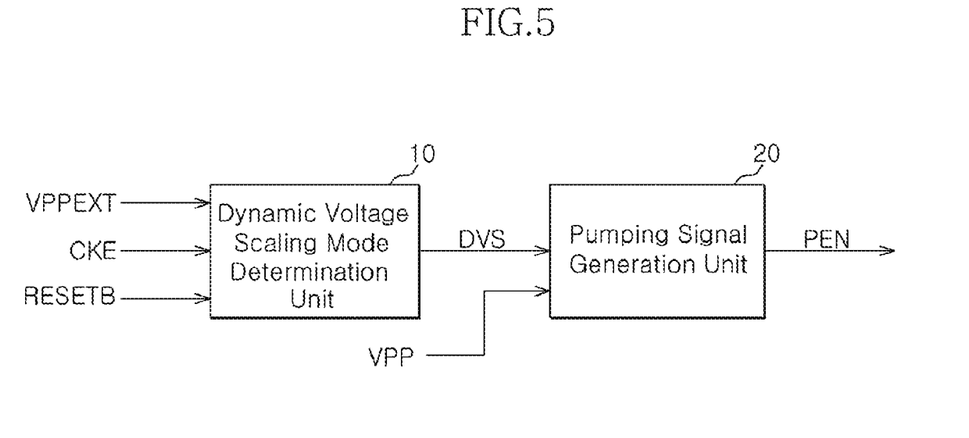
FIG. 5 is a block diagram of an apparatus for detecting a pumping voltage according to another embodiment.

FIG. 5 is a block diagram of an apparatus for detecting a pumping voltage according to another embodiment.

As described above, in a semiconductor apparatus including an apparatus for detecting a pumping voltage according to the conventional art, since the internal high voltage VPP with the same level is generated in the dynamic voltage scaling mode as in the normal mode without detecting the external high voltage VPPEXT, power may be unnecessarily consumed. In a semiconductor apparatus including the apparatus for detecting the pumping voltage according to another embodiment, different levels of internal high voltage VPPs are generated in the dynamic voltage scaling mode and in the normal mode, so as to prevent unnecessary power consumption.

The apparatus for detecting the pumping voltage shown in FIG. 5 is configured to generate a pumping enable signal PEN by using a comparison voltage which is generated from the internal high voltage VPP, having a different voltage level according to the dynamic voltage scaling mode signal. Thus, the semiconductor apparatus may control a pumping voltage level by the pumping enable signal PEN, so may generate the internal high voltage VPP with different levels according to the dynamic voltage scaling mode and the normal mode.

The apparatus for detecting the pumping voltage shown in FIG. 5 may include a dynamic voltage scaling mode determination unit 10 and a pumping signal generation unit 20.

The dynamic voltage scaling mode determination unit 10 is configured to generate the dynamic voltage scaling mode signal DVS in response to the clock enable signal CKE, the external high voltage VPPEXT, and the reset signal RESETB. The dynamic voltage scaling mode determination unit 10 may include the mode determination apparatus shown in FIG. 1. Since the dynamic voltage scaling mode determination unit 10 may perform an operation of initializing the dynamic voltage scaling mode signal DVS in response to the reset signal RESETB, the dynamic voltage scaling mode determination unit 10 may include the signal processing block 300B shown in FIG. 4B. Since the configuration and operation of the dynamic voltage scaling mode determination unit 10 have been described in FIGS. 1 to 3 and 4A and 4B, detailed description will be omitted.

The pumping signal generation unit 20 is configured to generate the pumping enable signal PEN by comparing the internal high voltage VPP with the different comparison voltage according to the dynamic voltage scaling mode signal DVS. For example, when operating in the normal mode, the pumping signal generation unit 20 sets the comparison voltage to 3V and activates the pumping enable signal PEN according to whether the internal high voltage VPP is larger than 3V. When operating in the dynamic voltage scaling mode, the pumping signal generation unit 20 sets the comparison voltage to 2V and activates the pumping enable signal PEN according to whether the internal high voltage VPP is larger than 2V. Since the pumping enable signal PEN is used to control the pumping operation of the semiconductor apparatus including the apparatus for detecting the pumping voltage, the internal high voltage VPP generated in the semiconductor apparatus including the apparatus for detecting the pumping voltage is 3V in the normal mode and is 2V in the dynamic voltage scaling mode.

Figure 6:
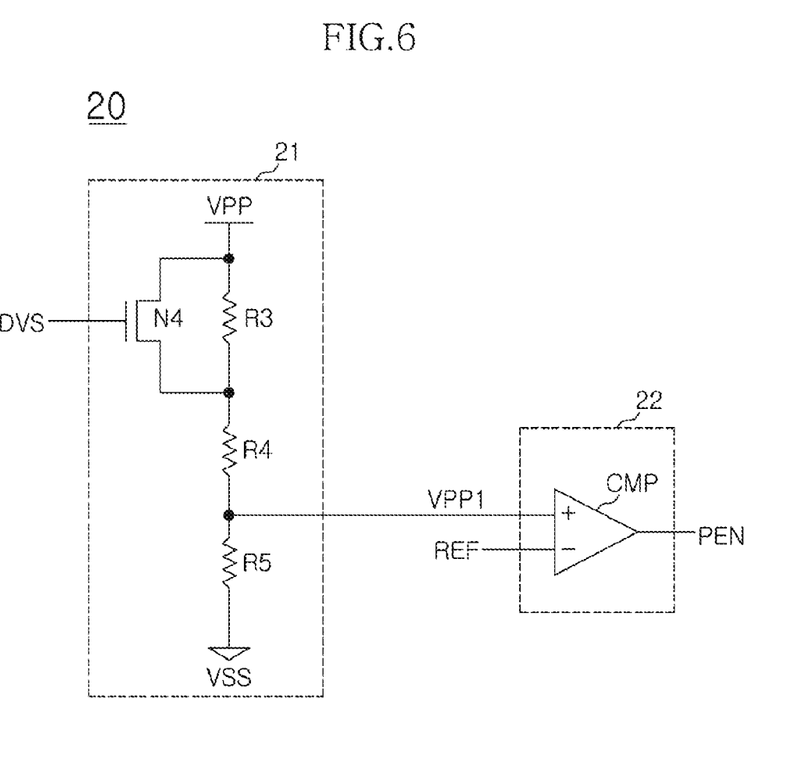
FIG. 6 is a circuit diagram of a pumping signal generation unit 20 shown in FIG. 5 according to one embodiment.

FIG. 6 is a circuit diagram of the pumping signal generation unit 20 shown in FIG. 5 according to one embodiment. In the voltage comparison for the internal high voltage VPP, the internal high voltage may be divided to generate a comparative high voltage VPP1 and the comparative high voltage VPP1 may be compared with a reference voltage REF.

The pumping signal generation unit 20 may include a voltage division section 21 and a voltage comparison section 22.

The voltage division section 21 is configured to divide the internal high voltage VPP by changing a voltage division ratio according to the dynamic voltage scaling mode signal to generate the comparative high voltage VPP1.

The voltage comparison section 22 is configured to compare the comparative high voltage VPP1 with the reference voltage REF to generate the pumping enable signal PEN.

The voltage division section 21 may include third to fifth resistors R3 to R5 and a fourth NMOS transistor N4. The fifth resistors R3 to R5 are connected in series between a terminal for the internal high voltage VPP and a terminal for a ground voltage VSS. The fourth NMOS transistor N4 is connected in parallel to the third resistor R3 to serve as a bypass with respect to the third resistor R3, and receives the dynamic voltage scaling mode signal DVS through a gate thereof. The voltage level of a common node of the fourth resistor R4 and the fifth resistor R5 is outputted as the comparative high voltage VPP1. The internal high voltage VPP is voltage-divided at different voltage division ratios as the fourth NMOS transistor N4 receiving the dynamic voltage scaling mode signal DVS is turn on or off.

The voltage comparison section 22 may include a comparator CMP. The comparator CMP is configured to compare the comparative high voltage VPP1 with the reference voltage REF, and output the comparison result as the pumping enable signal.

Figure 7:
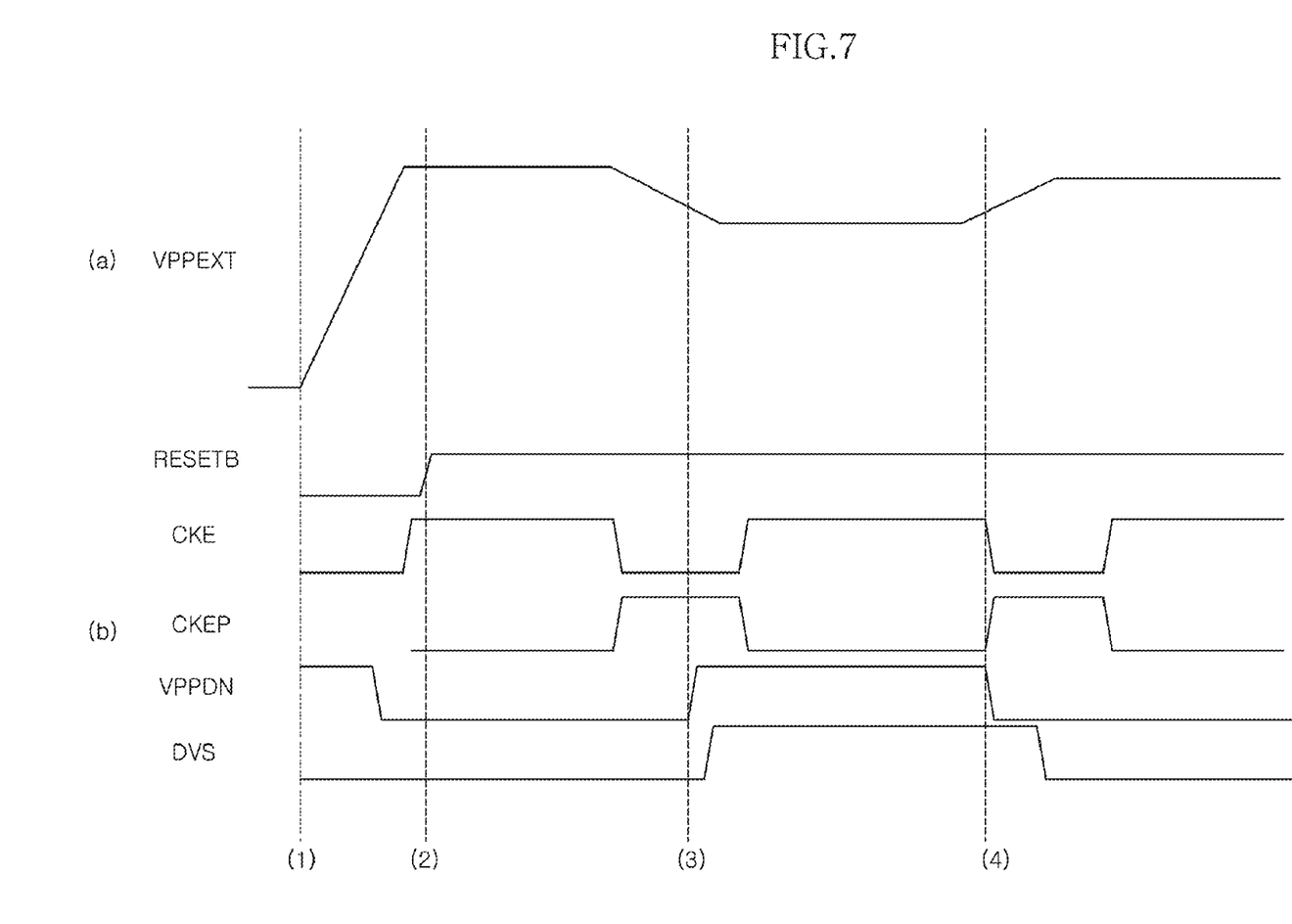
FIG. 7 is a diagram illustrating waveforms of signals inputted to and outputted from an apparatus for detecting a pumping voltage as shown in FIG. 5.

FIG. 7 is a diagram illustrating waveforms of signals inputted to and outputted from the apparatus for detecting the pumping voltage as shown in FIG. 5.

FIG. 7 illustrates the voltage level of the external high voltage VPPEXT inputted to the semiconductor apparatus including the apparatus for detecting the pumping voltage (a). Referring to (a) of FIG. 7, when the semiconductor apparatus is powered on, the external high voltage VPPEXT is increased during the initialization period (1 and 2) and reaches a level corresponding to the normal mode (2). When the semiconductor apparatus enters the dynamic voltage scaling mode, the external high voltage VPPEXT is changed to a level as compared with the normal mode (3). When the dynamic voltage scaling mode is ended and the semiconductor apparatus enters the normal mode again, the external high voltage VPPEXT is increased to the level corresponding to the normal mode (4).

FIG. 7 further illustrates the waveforms of the signals inputted to and outputted from the apparatus for detecting the pumping voltage (b). Referring to (b) of FIG. 7, in the initialization step (1 and 2) of the semiconductor apparatus, the reset signal RESETB is activated to a low level, so that the dynamic voltage scaling mode signal DVS is initialized to a low level (1 and 2). When the semiconductor apparatus enters the normal mode (2), since the external high voltage VPPEXT is equal to or more than a predetermined level, the second condition signal VPPDN is deactivated to a low level. Thus, the dynamic voltage scaling mode signal DVS substantially maintains the low level. As the clock enable signal CKE is activated to a low level, the first condition signal CKEP is activated. When the external high voltage VPPEXT is lowered to the predetermined level or less and the second condition signal VPPDN is activated (3), the dynamic voltage scaling mode signal DVS is activated. When the external high voltage VPPEXT is increased to the predetermined level or more, the second condition signal VPPDN is deactivated, the clock enable signal CKE is activated, and the first condition signal CKEP is activated (4), the dynamic voltage scaling mode signal DVS is deactivated.

While the apparatus for detecting the pumping voltage operates in the dynamic voltage scaling mode (3 and 4), the apparatus for detecting the pumping voltage divides the internal high voltage VPP at a predetermined voltage division ratio. At the voltage division ratio (hereinafter, referred to as a low power ratio), a low internal high voltage VPP is generated as compared with the normal mode. The apparatus for detecting the pumping voltage is configured to generate the comparative high voltage VPP1 by dividing the internal high voltage VPP at the low power ratio, and generate the pumping enable signal PEN by comparing the comparative high voltage VPP1 with the reference voltage REF.

When the apparatus for detecting the pumping voltage stops operating in the dynamic voltage scaling mode and operates in the normal mode (4), the apparatus for detecting the pumping voltage divides the internal high voltage VPP at a predetermined voltage division ratio. At the voltage division ratio (hereinafter, referred to as an average power ratio), a high internal high voltage VPP is generated as compared with the dynamic voltage scaling mode. The apparatus for detecting the pumping voltage is configured to generate the comparative high voltage VPP1 by dividing the internal high voltage VPP at the average power ratio, and generate the pumping enable signal PEN by comparing the comparative high voltage VPP1 with the reference voltage REF.

As described above, according to one embodiment, it may be possible to determine whether the semiconductor apparatus operates in the dynamic voltage scaling mode. The fact that it may be possible to determine the dynamic voltage scaling mode in the semiconductor apparatus may be more advantageous for the operational characteristics of the semiconductor apparatus as mentioned below. In the apparatus for detecting the pumping voltage according to another embodiment, the internal high voltage VPP with different levels is generated according to the dynamic voltage scaling mode and the normal mode, so that power may be substantially prevented from being unnecessarily consumed. Furthermore, in a general dynamic voltage scaling mode, a semiconductor apparatus performs a low frequency operation, that is, a low speed operation, as compared with the normal mode. In this regard, in the case in which the embodiments are applied to an input buffer circuit such as a clock buffer, an address buffer and a command buffer, when the semiconductor apparatus enters the dynamic voltage scaling mode and then changes to a low speed operation from a high speed operation, current consumption of the input buffer may be reduced. In addition, when the embodiments are applied to a DLL circuit, since it may be possible to stop an operation for an additional circuit that reduces jitter required for the high speed operation, current consumption may be reduced. Moreover, even if the embodiments are applied to the generation of a negative voltage such as a VBB, as well as the high voltage generation according to another embodiment as presented above, it may be possible to appropriately adjust a pumping operation for the low speed operation, current consumption may be reduced.

While certain embodiments have been described above, it will be understood to those skilled in the art that the embodiments described are by way of example only. Accordingly, a mode determination apparatus and an apparatus for detecting a pumping voltage described herein should not be limited based on the described embodiments. Rather, the mode determination apparatus and the apparatus for detecting the pumping voltage described herein should only be limited in light of the claims that follow when taken in conjunction with the above description and accompanying drawings.

What is claimed is:

1. A mode determination apparatus in a semiconductor apparatus, comprising:
 a first condition detection block configured to generate a first condition signal in response to a clock enable signal, the clock enable signal being activated when the semiconductor apparatus enters a dynamic voltage scaling mode;
 a second condition detection block configured to generate a second condition signal in response to an external high voltage in the dynamic voltage scaling mode, the external high voltage having a voltage level in the dynamic voltage scaling mode different from a voltage level in a normal mode; and
 a signal processing block configured to generate a dynamic voltage scaling mode signal in response to the first condition signal and the second condition signal.

2. The apparatus according to claim 1, wherein the first condition signal is activated with a predetermined time of pulse width when the clock enable signal is activated.

3. The apparatus according to claim 1, wherein the second condition detection block is configured to compare the external high voltage with a predetermined level and output a comparison result as the second condition signal.

4. The apparatus according to claim 1, wherein the signal processing block is configured to activate the dynamic voltage scaling mode signal when both the first condition signal and the second condition signal are activated, and deactivate the dynamic voltage scaling mode signal when the first condition signal is activated and the second condition signal is deactivated.

5. The apparatus according to claim 1, wherein the signal processing block comprises:
 a signal change unit configured to drive a state node in response to the first condition signal and the second condition signal; and
 a signal maintaining unit configured to output a voltage of the state node as the dynamic voltage scaling mode signal and latch the voltage of the state node.

6. The apparatus according to claim 5, wherein the signal change unit comprises:

a signal activation unit configured to charge the state node when both the first condition signal and the second condition signal are activated; and a signal deactivation unit configured to discharge the state node when the first condition signal is activated and the second condition signal is deactivated.

7. The apparatus according to claim 5, wherein the signal maintaining unit is configured to additionally receive a reset signal and initialize the dynamic voltage scaling mode signal in response to the reset signal.

8. The apparatus according to claim 7, wherein the signal maintaining unit comprises:

a latch initialized in response to the reset signal.

9. A method for determining a dynamic voltage scaling mode, comprising the steps of:

activating a first condition signal by detecting whether a clock enable signal is activated;

activating a second condition signal by detecting that an external high voltage is lowered to a predetermined level or less; and activating a dynamic voltage scaling mode signal in response to the first condition signal and the second condition signal.

10. The method according to claim 9, wherein the step of activating the dynamic voltage scaling mode signal comprises the steps of:

driving a state node in response to the first condition signal and the second condition signal; and outputting a voltage of the state node as the dynamic voltage scaling mode signal and latching the voltage of the state node.

11. An apparatus for detecting a pumping voltage in a semiconductor apparatus, comprising:

a dynamic voltage scaling mode determination unit configured to generate a dynamic voltage scaling mode signal that is activated when the semiconductor apparatus enters a dynamic voltage scaling mode; and a pumping signal generation unit configured to generate a pumping enable signal by dividing an internal high voltage differently according to the dynamic voltage scaling mode signal.

12. The apparatus according to claim 11, wherein the dynamic voltage scaling mode determination unit comprises:

a first condition detection block configured to generate a first condition signal in response to a clock enable signal activated when entering the dynamic voltage scaling mode;

a second condition detection block configured to generate a second condition signal in response to an external high voltage in the dynamic voltage scaling mode, wherein a voltage level of the external high voltage in the dynamic voltage scaling mode is different from the voltage level in a normal mode; and a signal processing block configured to generate the dynamic voltage scaling mode signal in response to the first condition signal and the second condition signal.

13. The apparatus according to claim 12, wherein the first condition signal is activated with a predetermined time of pulse width when the clock enable signal is activated.

14. The apparatus according to claim 12, wherein the second condition detection block is configured to compare the external high voltage with a predetermined level and output a comparison result as the second condition signal.

15. The apparatus according to claim 12, wherein the signal processing block is configured to activate the dynamic voltage scaling mode signal when both the first condition signal and the second condition signal are activated, and deactivate the dynamic voltage scaling mode signal when the first condition signal is activated and the second condition signal is deactivated.

16. The apparatus according to claim 12, wherein the signal processing block comprises:

a signal change unit configured to drive a state node in response to the first condition signal and the second condition signal; and a signal maintaining unit configured to output a voltage of the state node as the dynamic voltage scaling mode signal and latch the voltage of the state node.

17. The apparatus according to claim 16, wherein the signal change unit comprises:

a signal activation unit configured to charge the state node when both the first condition signal and the second condition signal are activated; and a signal deactivation unit configured to discharge the state node when the first condition signal is activated and the second condition signal is deactivated.

18. The apparatus according to claim 16, wherein the signal maintaining unit is configured to additionally receive a reset signal and initialize the dynamic voltage scaling mode signal in response to the reset signal.

19. The apparatus according to claim 18, wherein the signal maintaining unit comprises:

a latch initialized in response to the reset signal.

20. The apparatus according to claim 11, wherein the pumping signal generation unit comprises:

a voltage division section configured to divide the internal high voltage by changing a voltage division ratio according to the dynamic voltage scaling mode signal to generate a comparative high voltage; and a voltage comparison section configured to compare the comparative high voltage with a reference voltage to generate the pumping enable signal.

21. A method for detecting a pumping voltage, comprising the steps of:

activating a first condition signal by detecting whether a clock enable signal is activated;

activating a second condition signal by detecting that an external high voltage is substantially equal to or lower than a predetermined level;

activating a dynamic voltage scaling mode signal in response to the first condition signal and the second condition signal;

dividing an internal high voltage differently according to the dynamic voltage scaling mode signal to generate a comparative high voltage; and comparing the comparative high voltage with a reference voltage to generate a pumping enable signal.

22. The method according to claim 21, wherein the step of activating the dynamic voltage scaling mode signal comprises the steps of:

driving a state node in response to the first condition signal and the second condition signal; and outputting a voltage of the state node as the dynamic voltage scaling mode signal and latching the voltage of the state node.

23. The method according to claim 22, further comprising, before the step of activating the first condition signal, a step of initializing the dynamic voltage scaling mode signal in response to a reset signal.

* * * * *